US 10,498,373 B1

United States Patent
Simon

(10) Patent No.: US 10,498,373 B1
(45) Date of Patent: Dec. 3, 2019

(54) BROADBAND SENDER SYSTEM AND METHOD FOR RUNNING THE LATTER

(71) Applicant: Rohde & Schwarz GmbH & Co. KG, Munich (DE)

(72) Inventor: Martin Simon, Otterfing (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days.

(21) Appl. No.: 16/118,022

(22) Filed: Aug. 30, 2018

(51) Int. Cl.
*H04B 1/04* (2006.01)
*H03D 7/16* (2006.01)
*H03M 1/66* (2006.01)

(52) U.S. Cl.
CPC .......... *H04B 1/0475* (2013.01); *H03D 7/165* (2013.01); *H03M 1/66* (2013.01)

(58) Field of Classification Search
CPC .............................. H04B 1/0475; H03D 7/165
See application file for complete search history.

(56) References Cited

U.S. PATENT DOCUMENTS

| | | | | |
|---|---|---|---|---|
| 6,185,201 B1 * | 2/2001 | Kiyanagi | ................. | H04B 1/40 370/343 |
| 2003/0227982 A1 * | 12/2003 | Chen | .................... | H03C 3/403 375/302 |
| 2006/0256216 A1 | 11/2006 | Takahiko et al. | | |
| 2016/0261240 A1 | 9/2016 | Matsumoto et al. | | |

* cited by examiner

*Primary Examiner* — Kabir A Timory
(74) *Attorney, Agent, or Firm* — Ditthavong & Steiner P.C.

(57) ABSTRACT

A broadband sender system is provided. The broadband sender system comprises a radio frequency digital-to-analog converter. In this context, the radio frequency digital-to-analog converter is adapted to emit a baseband signal modulated on a carrier signal with a first intermediate frequency and a second intermediate frequency. In addition to this, the first intermediate frequency is higher than the second intermediate frequency.

18 Claims, 3 Drawing Sheets

US 10,498,373 B1

BROADBAND SENDER SYSTEM AND METHOD FOR RUNNING THE LATTER

TECHNICAL FIELD

The invention relates to a broadband sender system and a corresponding method for running said broadband sender system.

BACKGROUND ART

Generally, in times of an increasing number of applications providing wireless communication capabilities, there is a growing need of a broadband sender system and a corresponding method for running said broadband sender system especially in order to verify correct functioning of said applications in an accurate, efficient and cost-effective manner.

US 2016/0261240 A1 discloses a system comprising a linearizer module, a first upconverter module, a power amplifier module, a signal sampler module, and a downconverter module. The linearizer module is configured to receive a first intermediate frequency signal and to adjust the first intermediate frequency signal based on a reference signal and a signal based on a second intermediate frequency signal. The first upconverter module is configured to receive and up-convert a signal based on the adjusted first intermediate frequency signal to a radio frequency signal. The power amplifier module is configured to receive and amplify a power of a signal based on the radio frequency signal. The signal sampler module is configured to sample a signal based on the amplified radio frequency signal. The downconverter module is configured to receive and down-convert a signal based on the sampled radio frequency signal to the second intermediate frequency signal. As it can be seen, due to the variety of circuit stages, said system is complex, and thus expensive, whereas the usage thereof disadvantageously leads to an increased noise and distortion.

Accordingly, there is a need to provide a broadband sender system and a corresponding method for running said broadband sender system, each of which ensures a high accuracy, a high efficiency and reduced costs.

SUMMARY OF THE INVENTION

According to a first aspect of the invention a broadband sender system is provided. The broadband sender system comprises a radio frequency digital-to-analog converter. In this context, the radio frequency digital-to-analog converter is adapted to emit a baseband signal modulated on a carrier signal with a first intermediate frequency and a second intermediate frequency. In addition to this, the first intermediate frequency is higher than the second intermediate frequency. Advantageously, in this manner, accuracy and efficiency can be increased but also costs can be reduced.

According to a first implementation form of said first aspect of the invention, the broadband sender system further comprises a downconverter, wherein the downconverter is adapted to transform the signal of the first intermediate frequency to a lower frequency. Advantageously, for instance, complexity, and thus also costs, can be reduced.

According to a second implementation form of said first aspect of the invention, the broadband sender system further comprises an upconverter, wherein the upconverter is adapted to transform the signal of the second intermediate frequency to a higher frequency. Advantageously, complexity, and thus also costs, can be reduced.

According to a further implementation form of said first aspect of the invention, the carrier signal fed into the downconverter has a higher frequency than the first intermediate frequency and the second intermediate frequency. Advantageously, accuracy can further be increased.

According to a further implementation form of said first aspect of the invention, the carrier signal has a higher frequency than the output signal. Advantageously, noise can further be reduced.

According to a further implementation form of said first aspect of the invention, the carrier signal fed into the upconverter has a higher frequency than the first intermediate frequency and the second intermediate frequency. Advantageously, accuracy and efficiency can further be increased.

According to a further implementation form of said first aspect of the invention, the carrier signal has a higher frequency than the output signal. Advantageously, noise can further be reduced.

According to a further implementation form of said first aspect of the invention, the broadband sender system further comprises a lowpass filter, wherein the lowpass filter is adapted to remove the signal of the first intermediate frequency and the carrier signal from the downconverted signal outputted by the downconverter. Advantageously, accuracy and efficiency can further be increased.

According to a further implementation form of said first aspect of the invention, the broadband sender system further comprises a bandpass filter, wherein the bandpass filter is adapted to remove the signal of the second intermediate frequency and the carrier signal from the upconverted signal outputted by the upconverter. Advantageously, accuracy and efficiency can further be increased.

According to a further implementation form of said first aspect of the invention, the broadband sender system further comprises a mixer, wherein the mixer is provided at the radio frequency digital-to-analog converter to form the first intermediate frequency and the second intermediate frequency. Advantageously, complexity, and thus also costs, can further be reduced.

According to a further implementation form of said first aspect of the invention, the mixer comprises a high frequency output and a low frequency output. Advantageously, complexity, and thus costs, can be reduced, thereby also increasing efficiency.

According to a further implementation form of said first aspect of the invention, the mixer is adapted to output the first intermediate frequency with the high sideband of the mixer output signal. In addition to this or as an alternative, the mixer is adapted to output the second intermediate frequency with the low sideband of the mixer output signal. Advantageously, accuracy and efficiency can further be increased.

According to a further implementation form of said first aspect of the invention, the downconverter and the upconverter are combined in a single mixer. Advantageously, complexity, and thus costs, can further be reduced, thereby also increasing efficiency.

According to a further implementation form of said first aspect of the invention, the broadband sender system further comprises a numerically controlled oscillator. In this context, the numerically controlled oscillator is adapted to vary at least one of the first intermediate frequency and the second immediate frequency to provide a different frequency band. Additionally or alternatively, the numerically controlled oscillator is adapted to vary the carrier frequency to provide a different frequency band. Advantageously, for instance, accuracy can further be increased.

According to a further implementation form of said first aspect of the invention, the radio frequency digital-to-analog converter comprises the numerically controlled oscillator. Advantageously, complexity, and thus also costs, can further be reduced.

According to a further implementation form of said first aspect of the invention, the carrier frequency is higher than the maximum output frequency of the broadband sender system. Advantageously, accuracy can further be increased.

According to a further implementation form of said first aspect of the invention, the broadband sender system further comprises a vector modulator, wherein the vector modulator is adapted to transform the output signal of the radio frequency analog-to-digital converter into a first signal of the first intermediate frequency and a second signal of the second intermediate frequency. Advantageously, complexity, and thus costs, can further be reduced, thereby also increasing efficiency.

According to a second aspect of the invention, a method for running a broadband sender is provided. Said method comprises the steps of emitting a baseband signal, and modulating said baseband signal on a carrier signal with a first intermediate frequency and a second intermediate frequency. In this context, the first intermediate frequency is higher than the second intermediate frequency. Advantageously, in this manner, accuracy and efficiency can be increased but also costs can be reduced.

According to a first preferred implementation form of said second aspect of the invention, the method further comprises the steps of transforming the signal of the first intermediate frequency to a lower frequency, and/or transforming the signal of the second intermediate frequency to a higher frequency. Advantageously, for instance, complexity, and thus also costs, can be reduced.

BRIEF DESCRIPTION OF THE DRAWINGS

Exemplary embodiments of the invention are now further explained with respect to the drawings by way of example only, and not for limitation. In the drawings.

DETAILED DESCRIPTION OF THE PREFERRED EMBODIMENTS

Figure 1:
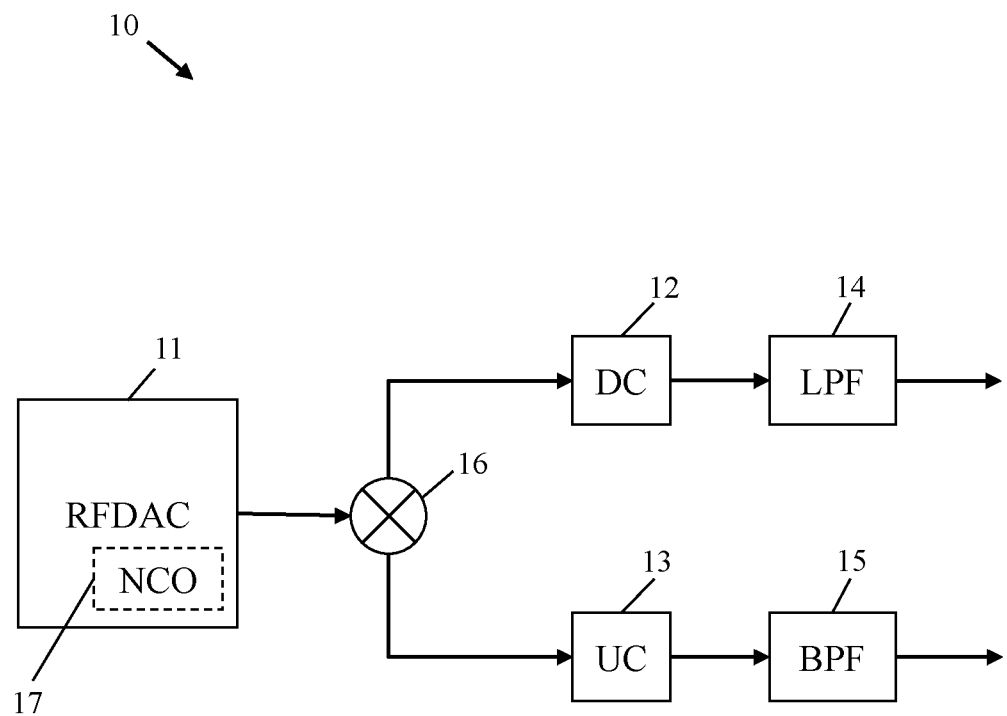
FIG. 1 shows a first exemplary embodiment of a broadband sender system according to the first aspect of the invention.

Firstly, FIG. 1 illustrates a first exemplary embodiment of the inventive broadband sender system 10. The broadband sender system 10 comprises a radio frequency digital-to-analog converter 11 comprising a numerically controlled oscillator 17, a downconverter 12, an upconverter 13, a lowpass filter 14, a bandpass filter 15, and a mixer 16.

In this context, the radio frequency digital-to-analog converter 11 is adapted to emit a baseband signal modulated on a carrier signal with a first intermediate frequency and a second intermediate frequency, wherein the first intermediate frequency is higher than the second intermediate frequency.

Furthermore, the downconverter 12 is especially adapted to transform the signal of the first intermediate frequency to a lower frequency, whereas the upconverter 13 is especially adapted to transform the signal of the second intermediate frequency to a higher frequency.

It might be particularly advantageous if the carrier signal fed into the downconverter 12 has a higher frequency than the first intermediate frequency and the second intermediate frequency. Additionally, the carrier signal may preferably have a higher frequency than the output signal.

Moreover, the carrier signal fed into the upconverter 13 may especially have a higher frequency than the first intermediate frequency and the second intermediate frequency. In addition to this, the carrier signal may preferably have a higher frequency than the output signal.

It is further noted that it might be particularly advantageous if the lowpass filter 14 is adapted to remove the signal of the first intermediate frequency and the carrier signal from the downconverted signal outputted by the downconverter 12.

Further advantageously, the bandpass filter 15 may especially be adapted to remove the signal of the second intermediate frequency and the carrier signal from the upconverted signal outputted by the upconverter 13.

As it can further be seen from FIG. 1, the mixer 16 is provided at the radio frequency digital-to-analog converter 11 to form the first intermediate frequency and the second intermediate frequency. In this context, the mixer 16 especially comprises a high frequency output and a low frequency output.

In addition to this, the mixer 16 may preferably be adapted to output the first intermediate frequency with the high sideband of the mixer output signal.

Additionally or alternatively, the mixer 16 may especially be adapted to output the second intermediate frequency with the low sideband of the mixer output signal.

It is noted that it might be particularly advantageous if the downconverter 12 and the upconverter 13 are combined in a single mixer, especially in the mixer 16.

With respect to the numerically controlled oscillator 17 of the radio frequency digital-to-analog converter 11, the numerically controlled oscillator 17 is especially adapted to vary at least one of the first intermediate frequency and the second immediate frequency to provide a different frequency band.

In addition to this or as an alternative, the numerically controlled oscillator 17 may preferably be adapted to vary the carrier frequency to provide a different frequency band.

Furthermore, it should be mentioned that the carrier frequency may preferably be higher than the maximum output frequency of the broadband sender system 10.

It is further noted that the broadband sender system 10 may further comprise a vector modulator. Said vector modulator may preferably be adapted to transform the output signal of the radio frequency analog-to-digital converter 11 into a first signal of the first intermediate frequency and a second signal of the second intermediate frequency. In this context, it might be particularly advantageous if the mixer 16 of the broadband sender system 10 is especially replaced by the vector modulator.

Figure 2:
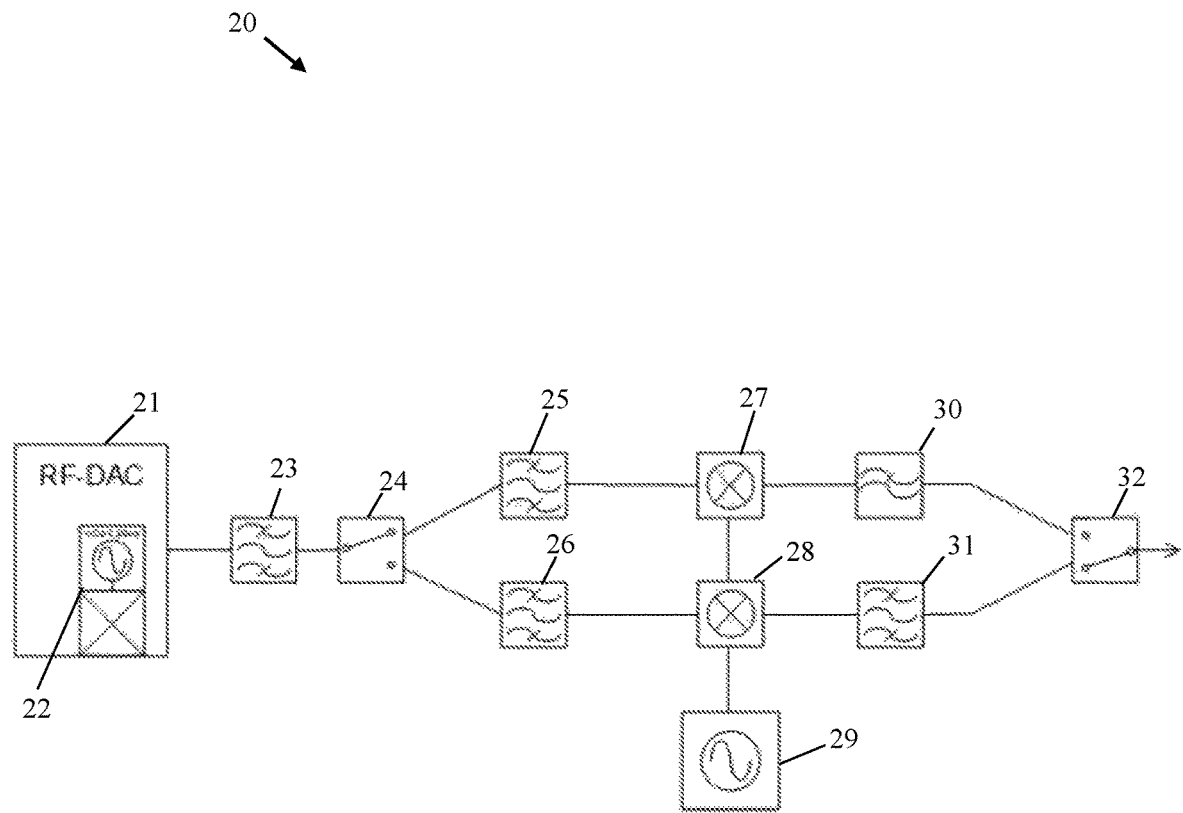
FIG. 2 shows a second exemplary embodiment of the inventive broadband sendersystem.

Now, with respect to FIG. 2, a second exemplary embodiment of the inventive broadband sender system 20 is illustrated. The broadband sender system 20 comprises a radio frequency digital-to-analog converter 21 comprising a numerically controlled osciallator.

The output of the radio frequency digital-to-analog converter 21 is connected to the input of a first filter, preferably a bandpass filter 23, wherein the output of the first filter is connected to the input of a first switch element 24.

Said first switch element 24 comprises a first output and a second output and is adapted to pass the input of the switch element 24 either to its first output or its second output.

Furthermore, the first output of the first switch element 24 is connected to the input of a second filter, preferably a bandpass filter 25, whereas the second output of the first switch element 24 is connected to the input of a third filter, preferably a bandpass filter 26.

The output signal of the second filter 25 is a signal of a first intermediate frequency according to the first intermediate frequency of the first embodiment 10 discussed above, whereas the output signal of the third filter 26 is a signal of a second intermediate frequency in accordance with the second intermediate frequency of the first embodiment 10.

In this context, it is noted that with respect to the first intermediate frequency, the second intermediate frequency, the frequency of the carrier signal, and the frequency of the output signal of the second embodiment 20, the same relationships between said frequencies apply analogously according to the first embodiment 10.

Moreover, the output of the second filter 25 is connected to an input of a first mixer 27, preferably a downconverter, whereas the output of the third filter 26 is connected to an input of a second mixer 28, preferably an upconverter.

Additionally, the output signal, especially the same output signal, of a local oscillator 29 is provided for both the first mixer 27 and the second mixer 28.

As it can further be seen from FIG. 2, the output of the first mixer 27 is connected to the input of a fourth filter, preferably a lowpass filter 30, whereas the output of the second mixer 28 is connected to the input of a fifth filter, preferably bandpass filter 31.

Furthermore, the output of the fourth filter 30 is connected to a first input of a second switch element 32, whereas the output of the fifth filter 31 is connect to a second input of the second switch element 32.

Said second switch element 32 comprises an output, especially the output of the system 20, and is adapted to pass either the output signal of the fourth filter 30 or the output signal of the fifth filter 31 to the output of the second switch element 32.

With respect to the numerically controlled oscillator 22 of the radio frequency digital-to-analog converter 21, the numerically controlled oscillator 22 is especially adapted to vary at least one of the first intermediate frequency and the second immediate frequency to provide a different frequency band.

In addition to this or as an alternative, the numerically controlled oscillator 22 may preferably be adapted to vary the carrier frequency to provide a different frequency band.

Moreover, with respect to each of the first exemplary embodiment 10 and the second exemplary embodiment 20 of the inventive broadband sender system, it is noted that by reducing the number of circuit stages to a minimum, distortion and noise can advantageously be reduced or even be avoided. Further advantageously, due to the fact that rather low local oscillator frequencies are sufficient for running the inventive broadband sender system, the broadband sender system according to the invention is low-noise. Additionally, in accordance with the invention, a single mixer is especially sufficient for realizing the inventive broadband sender system.

As a further advantage, the inventive broadband sender can be realized on particularly small space in a cost-efficient manner. In addition to this, the broadband sender system according to the invention allows for providing a broader frequency band without spurious emissions in comparison to the available frequency band of the digital-to-analog converter, especially of the radio frequency digital-to-analog converter. In this context, the frequency band of the digital-to-analog converter, especially the frequency band of the radio frequency digital-to-analog converter, may exemplarily be between 0 and 2 GHz, whereas the desired frequency band of the output, especially the frequency band of the output of the inventive broadband sender system, may exemplarily be between 0.4 and 8 GHz.

Figure 3:
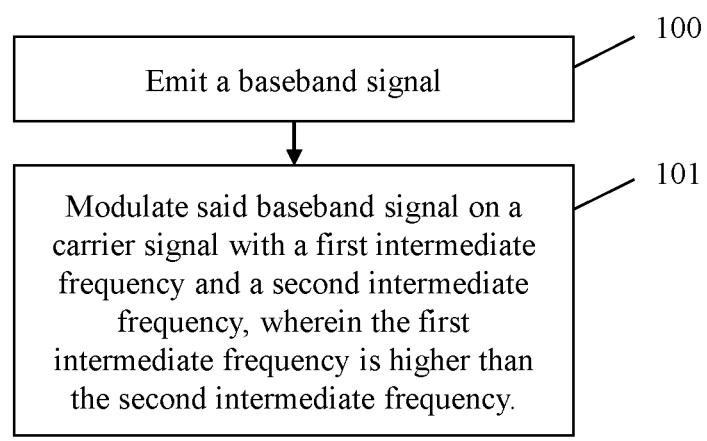
FIG. 3 shows a flow chart of an exemplary embodiment of the second aspect of the invention.

Finally, FIG. 3 shows a flow chart of an exemplary embodiment of the inventive method for running a broadband sender. In a first step 100, a baseband signal is emitted. Then, in a second step 101, said baseband signal is modulated on a carrier signal with a first intermediate frequency and a second intermediate frequency, wherein the first intermediate frequency is higher than the second intermediate frequency.

In this context, it might be particularly advantageous if the method further comprises the step of transforming or downconverting, respectively, the signal of the first intermediate frequency to a lower frequency.

In addition to this or as an alternative, the method may further comprise the step of transforming or upconverting, respectively, the signal of the second intermediate frequency to a higher frequency.

It is noted that the carrier signal—before transforming it to the lower frequency—may especially have a higher frequency than the first intermediate frequency and the second intermediate frequency. In addition to this, the carrier signal may preferably have a higher frequency than the output signal.

Moreover, the carrier signal—before transforming it to the higher frequency—may especially have a higher frequency than the first intermediate frequency and the second intermediate frequency. Additionally, the carrier signal may preferably have a higher frequency than the output signal.

Furthermore, it might be particularly advantageous if the method further comprises the step of removing the signal of the first intermediate frequency and the carrier signal from the downconverted signal.

Further advantageously, the method may further comprise the step of removing the signal of the second intermediate frequency and the carrier signal from the upconverted signal.

It is further noted that it might be particularly advantageous if the method further comprises the step of forming the first intermediate frequency and the second intermediate frequency with the aid of a mixer.

In addition to this, the mixer may preferably comprise a high frequency output and a low frequency output.

With further respect to said mixer, the mixer may especially be adapted to output the first intermediate frequency with the high sideband of the mixer output signal.

In addition to this or as an alternative, the mixer may preferably be adapted to output the second intermediate frequency with the low sideband of the mixer output signal.

Moreover, the method for running a broadband sender system may further comprise the step of varying at least one of the first intermediate frequency and the second immediate frequency to provide a different frequency band.

Additionally or alternatively, the method may further comprise the step of varying the carrier frequency to provide a different frequency band.

It is noted that the carrier frequency may preferably be higher than the maximum output frequency of the broadband sender system.

It is further noted that the method may advantageously comprise the step of transforming the emitted baseband signal modulated on a carrier signal with a first intermediate frequency and a second intermediate frequency into a first signal of the first intermediate frequency and a second signal of the second intermediate frequency with the aid of a vector modulator. In this context, it might be particularly advantageous if the above-mentioned mixer is especially replaced by the vector modulator.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A broadband sender system comprising:
a radio frequency digital-to-analog converter, and
a numerically controlled oscillator,
wherein the radio frequency digital-to-analog converter is adapted to emit a baseband signal modulated on a carrier signal with a first intermediate frequency and a second intermediate frequency,
wherein the first intermediate frequency is higher than the second intermediate frequency,
wherein the numerically controlled oscillator is adapted to vary at least one of the first intermediate frequency and the second intermediate frequency to provide a different frequency band, and
wherein the numerically controlled oscillator is adapted to vary a carrier frequency to provide a different frequency band.

2. The broadband sender system according to claim 1,
wherein the broadband sender system further comprises a downconverter,
wherein the downconverter is adapted to transform a signal of the first intermediate frequency to a lower frequency.

3. The broadband sender system according to claim 1,
wherein the broadband sender system further comprises an upconverter,
wherein the upconverter is adapted to transform a signal of the second intermediate frequency to a higher frequency.

4. The broadband sender system according to claim 2,
wherein the carrier signal fed into the downconverter has a higher frequency than the first intermediate frequency and the second intermediate frequency.

5. The broadband sender system according to claim 4,
wherein the carrier signal has a higher frequency than an output signal.

6. The broadband sender system according to claim 3,
wherein the carrier signal fed into the upconverter has a higher frequency than the first intermediate frequency and the second intermediate frequency.

7. The broadband sender system according to claim 6,
wherein the carrier signal has a higher frequency than an output signal.

8. The broadband sender system according to claim 2,
wherein the broadband sender system further comprises a lowpass filter,
wherein the lowpass filter is adapted to remove the signal of the first intermediate frequency and the carrier signal from a downconverted signal outputted by the downconverter.

9. The broadband sender system according to claim 3,
wherein the broadband sender system further comprises a bandpass filter,
wherein the bandpass filter is adapted to remove the signal of the second intermediate frequency and the carrier signal from an upconverted signal outputted by the upconverter.

10. The broadband sender system according to claim 1,
wherein the broadband sender system further comprises a mixer,
wherein the mixer is provided at the radio frequency digital-to-analog converter to form the first intermediate frequency and the second intermediate frequency.

11. The broadband sender system according to claim 10,
wherein the mixer comprises a high frequency output and a low frequency output.

12. The broadband sender system according to claim 11,
wherein the mixer is adapted to output the first intermediate frequency with a high sideband of a mixer output signal, and/or
wherein the mixer is adapted to output the second intermediate frequency with a low sideband of the mixer output signal.

13. The broadband sender system according to claim 2,
wherein the downconverter and an upconverter are combined in a single mixer.

14. The broadband sender system according to claim 1,
wherein the radio frequency digital-to-analog converter comprises the numerically controlled oscillator.

15. The broadband sender system according to claim 1,
wherein the carrier frequency is higher than a maximum output frequency of the broadband sender system.

16. The broadband sender system according to claim 1,
wherein the broadband sender system further comprises a vector modulator,
wherein the vector modulator is adapted to transform an output signal of the radio frequency analog-to-digital converter into a first signal of the first intermediate frequency and a second signal of the second intermediate frequency.

17. A method for running a broadband sender, the method comprising the steps of:
emitting a baseband signal,
modulating said baseband signal on a carrier signal with a first intermediate frequency and a second intermediate frequency,
wherein the first intermediate frequency is higher than the second intermediate frequency,
varying at least one of the first intermediate frequency and the second intermediate frequency to provide a different frequency band, and
varying a carrier frequency to provide a different frequency band.

18. The method according to claim 17,
wherein the method further comprises the step of:
transforming a signal of the first intermediate frequency to a lower frequency, and/or transforming a signal of the second intermediate frequency to a higher frequency.

\* \* \* \* \*